United States Patent
Yu et al.

(10) Patent No.: US 11,658,067 B2
(45) Date of Patent: May 23, 2023

(54) SEMICONDUCTOR STRUCTURE AND FORMATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Hailong Yu, Shanghai (CN); Jingjing Tan, Shanghai (CN); Hao Zhang, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 50 days.

(21) Appl. No.: 16/989,299

(22) Filed: Aug. 10, 2020

(65) Prior Publication Data

US 2021/0050258 A1    Feb. 18, 2021

(30) Foreign Application Priority Data

Aug. 12, 2019   (CN) .......................... 201910739469.X

(51) Int. Cl.
   *H01L 21/768*  (2006.01)
   *H01L 23/535*  (2006.01)
   *H01L 23/532*  (2006.01)

(52) U.S. Cl.
   CPC .. *H01L 21/76895* (2013.01); *H01L 21/76805* (2013.01); *H01L 21/76843* (2013.01);
   (Continued)

(58) Field of Classification Search
   CPC . H01L 21/285; H01L 21/2855; H01L 21/768; H01L 21/76805; H01L 21/76895; H01L 21/76843; H01L 21/76879; H01L 21/76831; H01L 21/76847; H01L 21/76846; H01L 21/76877; H01L 23/532;
   (Continued)

(56) References Cited

U.S. PATENT DOCUMENTS

2020/0402844 A1* 12/2020 Cheng ............... H01L 21/76846

FOREIGN PATENT DOCUMENTS

KR    1020110071267    *   6/2011   ......... H01L 21/3205

* cited by examiner

*Primary Examiner* — Chuong A Luu
(74) *Attorney, Agent, or Firm* — Anova Law Group, PLLC

(57) ABSTRACT

A method for forming a semiconductor structure includes providing an initial semiconductor structure formed in a substrate; forming a dielectric layer on the substrate; forming a first opening in the dielectric layer to expose a portion of the initial semiconductor structure; etching the portion of the initial semiconductor structure exposed at a bottom of the first opening to form a second opening in the initial semiconductor structure; and forming a contact layer in the second opening and a third opening in the contact layer. The contact layer has a concave top surface, and the third opening is located above the concave top surface of the contact layer and under the first opening. The method further includes forming a conductive structure in the first opening and the third opening.

19 Claims, 7 Drawing Sheets

(52) U.S. Cl.
CPC ...... *H01L 23/535* (2013.01); *H01L 23/53209* (2013.01); *H01L 23/53223* (2013.01); *H01L 23/53238* (2013.01); *H01L 23/53266* (2013.01)

(58) Field of Classification Search
CPC ............. H01L 23/535; H01L 23/53223; H01L 23/53238; H01L 23/53266; H01L 23/53209; H01L 23/522; H01L 23/538; H01L 23/5226; H01L 23/5386; H01L 23/528; H01L 31/0508; H01L 31/0516; H01L 21/8234; H01L 21/8238; H01L 21/823475; H01L 21/823871
USPC .................................................. 438/629, 637
See application file for complete search history.

SEMICONDUCTOR STRUCTURE AND FORMATION METHOD THEREOF

CROSS-REFERENCE TO RELATED APPLICATION

This application claims priority to Chinese Patent Application No. 201910739469.X, filed on Aug. 12, 2019, the entire content of which is incorporated herein by reference.

TECHNICAL FIELD

The present disclosure generally relates to the field of semiconductor manufacturing and, more particularly, relates to semiconductor structures and fabrication methods thereof.

BACKGROUND

With continuous development of semiconductor technologies, critical dimensions of semiconductor devices are gradually reduced. The reduction in the critical dimensions allows more transistors to be placed on one chip, which generates more challenges on semiconductor fabrication processes. As the dimension of the semiconductor device continuously decreases, the contact resistance of a metal-oxide-semiconductor (MOS) transistor plays more important roles on device performance of the MOS transistor and thus the entire semiconductor chip. To improve the device performance of the semiconductor chip, the contact resistance of MOS transistors in the semiconductor chip may need to be reduced.

To improve device performance of semiconductor structures, existing contact resistance, between a metal contact layer and a conductive structure or a source-drain doped region, is reduced by increasing the contact area.

However, it is still difficult to decrease contact resistance, e.g., between a metal silicide layer and a conductive structure, in a semiconductor structure formed by existing fabrication methods, leads to undesired device performance of the semiconductor structure. The disclosed semiconductor structures and fabrication methods thereof are directed to solve one or more problems set forth above and other problems in the art.

SUMMARY

The present disclosure provide a semiconductor structure and a fabrication method thereof. According to the present disclosure, by forming an additional opening in a contact layer, a contact area between a conductive structure and the contact layer is effectively increased and the contact resistance is reduced.

One aspect of the present disclosure provides a method for forming a semiconductor structure. The method includes providing an initial semiconductor structure formed in a substrate; forming a dielectric layer on the substrate; forming a first opening in the dielectric layer to expose a portion of the initial semiconductor structure; etching the portion of the initial semiconductor structure exposed at a bottom of the first opening to form a second opening in the initial semiconductor structure; and forming a contact layer in the second opening and a third opening in the contact layer. The contact layer has a concave top surface, and the third opening is located above the concave top surface of the contact layer and under the first opening. The method further includes forming a conductive structure in the first opening and the third opening.

Optionally, the substrate has a single-layer structure or a multi-layer structure.

Optionally, when the substrate has a single-layer structure, the substrate includes an initial substrate and an epitaxial layer formed in the initial substrate. The initial semiconductor structure is the epitaxial layer.

Optionally, when the substrate has a multi-layer structure, the substrate includes a base substrate and a device layer formed on the base substrate, and the device layer includes a device structure and a device dielectric layer surrounding the device structure. The initial semiconductor structure includes the device structure.

Optionally, the method further includes doping first type ions into the initial semiconductor structure.

Optionally, doping the first type ions into the initial semiconductor structure includes an in-situ doping process.

Optionally, the first type ions include P-type ions or N-type ions. The P-type ions include boron ions, indium ions, or a combination thereof, and the N-type ions include phosphorus ions, arsenic ions, or a combination thereof.

Optionally, forming the contact layer and the third opening includes forming an initial contact layer in the second opening; performing a sputtering process on the initial contact layer to form an initial third opening in the initial contact layer, the initial third opening located under the first opening; and performing an annealing process on the initial contact layer to form the contact layer and the third opening in the contact layer.

Optionally, forming the initial contact layer includes a physical vapor deposition (PVD) process.

Optionally, processing parameters of the annealing process include an annealing temperature in a range of approximately 750° C. to 850° C. and an annealing time in a range of approximately 170 seconds to 190 seconds.

Optionally, the initial contact layer is made of a material including titanium, nickel, platinum, or a combination thereof.

Optionally, ions used in the sputtering process include titanium ions, argon ions, or combination thereof.

Optionally, processing parameters of the sputtering process include a sputtering time in a range of 15 seconds to 25 seconds and a sputtering power of 1800 W to 2200 W.

Optionally, the conductive structure includes a barrier layer formed on a bottom surface of the third opening and a sidewall surface of the first opening, and a conductive plug formed on the barrier layer.

Optionally, the conductive structure is formed prior to forming the contact layer, or the conductive structure is formed after forming the contact layer.

Optionally, the barrier layer is made of a material including titanium nitride.

Optionally, the barrier layer is formed by an atomic layer deposition (ALD) process.

Optionally, the conductive plug is made of a material including tungsten, cobalt, copper, aluminum, or a combination thereof.

Optionally, the initial third opening has a concave bottom surface.

Another aspect of the present disclosure provides a semiconductor structure. The semiconductor structure is formed by a method according to the present disclosure. The semiconductor structure includes a substrate; an initial semiconductor structure, formed in the substrate; and a dielectric layer, formed on the substrate. A first opening is formed in the dielectric layer and exposing a portion of the initial semiconductor structure, and a second opening is formed into the initial semiconductor structure under the first opening. The semiconductor structure further includes a contact layer, formed in the second opening and having a concave top surface. The concave top surface of the contact layer includes a third opening under the first opening. The semiconductor structure also includes a conductive structure, formed in the first opening and the third opening.

Compared to the existing technology, the technical solutions of the present disclosure have the following advantages.

In the technical solution of the present disclosure, by forming the third opening in the contact layer, the conductive plug is formed in the third opening. Since the surface of the third opening includes the concave surface structure, the contact interface formed between the conductive structure and the contact layer and in the third opening is ensured to include the concave surface structure. Compare the concave surface structure to a horizontally-flat surface structure, the contact area is effectively increased. The contact area is increased in the direction of the electrical path of the conductive structure, that is, a resistor is parallelly connected, the total resistance thus is smaller than any of the resistors. As such, the contact resistance between the conductive structure and the contact layer is reduced.

Further, in the technical solution of the present disclosure, the ions used in the sputtering process and the metal material used in the deposition process to form the initial contact layer both include titanium. Since the same substance is used, the process of replacing the equipment is eliminated, and the production efficiency is effectively increased.

Further, in the technical solution of the present disclosure, the barrier layer is formed by using the ALD process. Since the ALD process deposits the substance layer by layer in the form of a single atomic film on the surface of the substrate, the ALD process has good shape retention. Therefore, the barrier layer formed by the ALD process can maintain the concave surface structure of the third opening. As such, the contact interface between the barrier layer and the conductive plug can also be ensured to include a concave surface structure. With the same width, the area of the concave surface is larger than the surface area of the horizontal plane. Therefore, the contact area between the conductive plug and the barrier layer is effectively increased. The contact area is increased in the direction of the electrical path of the conductive structure, this is, a resistor is parallelly connected, the total resistance thus is smaller than any one of the resistors. As such, the contact resistance between the conductive structure and the contact layer is reduced.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the present disclosure, which are illustrated in the accompanying drawings. Wherever possible, the same reference numbers will be used throughout the drawings to refer to the same or like parts.

Figure 1:
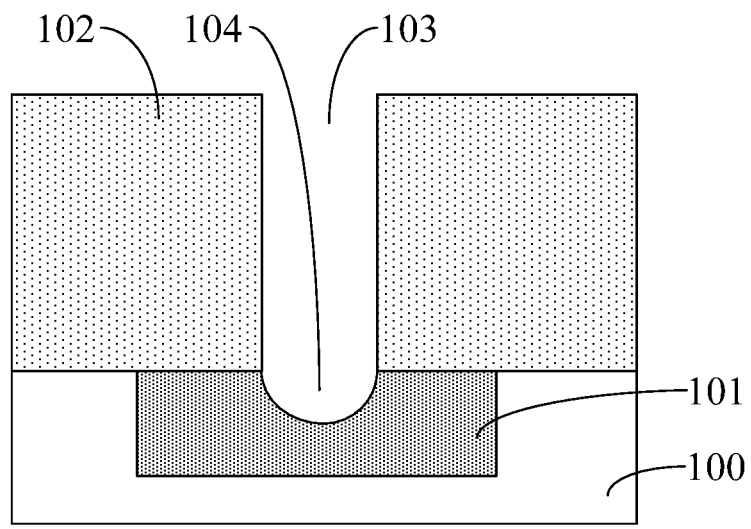
FIG. 1 to FIG. 3 illustrate schematic cross-sectional views of semiconductor structures at certain stages of a fabrication process of a semiconductor structure.
Figure 2:
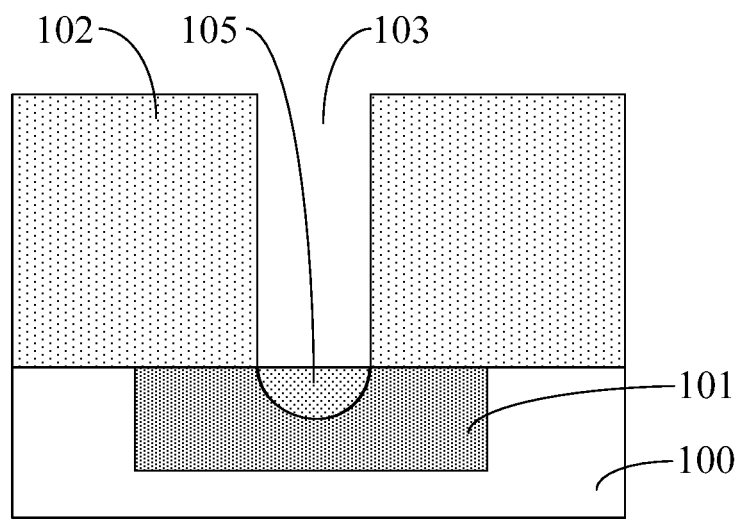
Figure 3:
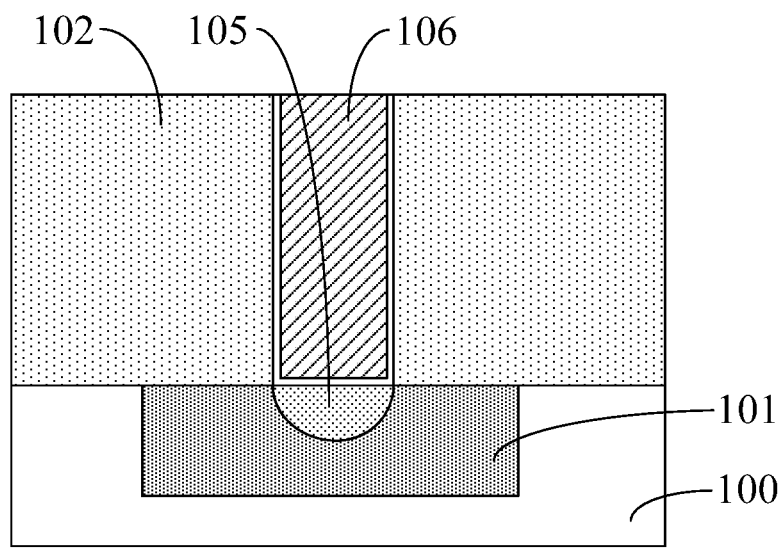

FIG. 1 to FIG. 3 illustrate schematic cross-sectional views of semiconductor structures at certain stages of a fabrication process of a semiconductor structure. Referring to FIG. 1, a substrate 100 is provided. A first opening (not shown) is formed in the substrate. An epitaxial layer 101 is formed in the first opening. A dielectric layer 102 is formed over the substrate 100, and a second opening 103 is formed in the dielectric layer 102. The second opening 103 may expose a portion of the epitaxial layer 101. A portion of the epitaxial layer 101 exposed at the bottom of the second opening 103 is etched, such that a third opening 104 is formed in the epitaxial layer 101.

Referring to FIG. 2, a contact layer 105 is formed on the sidewall and bottom surfaces of the third opening 104 by a semiconductor metallization process.

Referring to FIG. 3, a conductive structure 106 is formed on the surface of the contact layer 105, and the conductive structure 106 is located in the second opening 103.

According to the embodiments described above, because the contact layer 105 is formed by a physical vapor deposition (PVD) process, the contact layer 105 has a horizontally-flat top surface. Therefore, the contact interface between the conductive structure 106 and the contact layer 105 is also a horizontally-flat structure. Because the interface area of the horizontally-flat contact structure is small, the contact resistance between the conductive structure 106 and the contact layer 105 is relatively large.

To reduce the contact resistance in semiconductor structures, the present disclosure provides a method for forming semiconductor structures. By forming a third opening at the contact surface, it can be ensured that the contact interface formed between the conductive structure and the contact layer has a concave surface structure. Compare the concave surface structure to the horizontally-flat structure, the contact area is effectively enlarged, such that the contact resistance is reduced.

To make the objectives, technical solutions, and advantages clearer, the present disclosure is further described in detail below in connection with accompanying drawings and embodiments.

Figure 12:
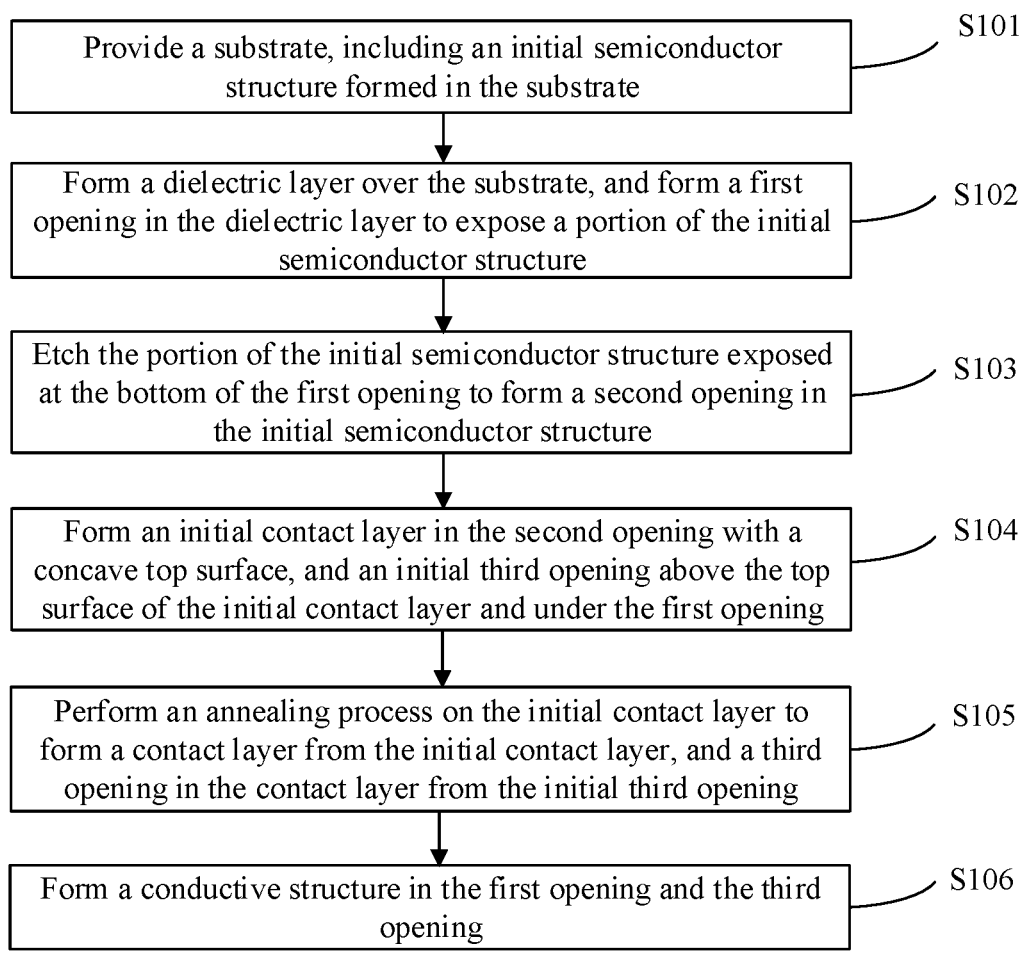
FIG. 12 illustrates a flowchart of an exemplary method for forming a semiconductor structure according to some embodiments in the present disclosure.

FIG. 12 illustrates a flowchart of an exemplary method for forming a semiconductor structure according to some embodiments in the present disclosure. FIG. 4 to FIG. 9 illustrate schematic cross-sectional views of semiconductor structures at certain stages of the exemplary method.

Figure 4:
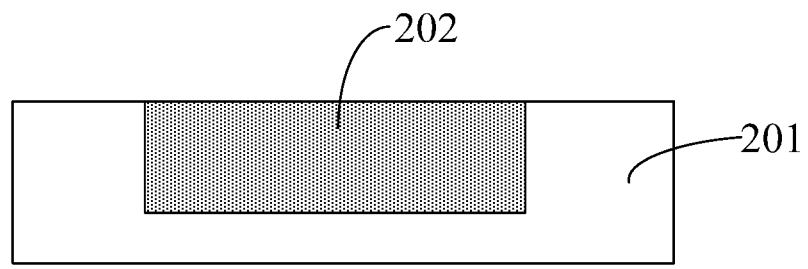
FIG. 4 to FIG. 9 illustrate schematic cross-sectional views of semiconductor structures at certain stages of an exemplary method for fabricating a semiconductor structure according to some embodiments in the present disclosure.

Referring to FIG. 12, in S101, a substrate is provided, and the substrate may include an initial semiconductor structure disposed in the substrate. FIG. 4 illustrates a schematic cross-sectional view of a semiconductor structure according to some embodiments of the present disclosure.

Referring to FIG. 4, a substrate 201 containing an initial semiconductor structure 202 is provided. The initial semiconductor structure 202 may be formed in the substrate 201.

In one embodiment, the substrate 201 may have a single-layer structure. For example, the substrate 201 may include an initial substrate, and an epitaxial layer formed in the initial substrate. The initial semiconductor structure 202 may be the epitaxial layer.

In one embodiment, the initial substrate may be made of silicon (Si). In other embodiments, the initial substrate may be made of a material including germanium (Ge), silicon germanium (SiGe), silicon carbide (SiC), gallium arsenide (GaAs), or indium gallium (InGa). Alternatively, the initial substrate may have a composite structure, such as silicon on insulater (SOI) or germanium on insulator (GOI).

In one embodiment, forming the substrate 201 may include forming a substrate opening in the initial substrate and forming the initial semiconductor structure 202 in the substrate opening.

In one embodiment, forming the substrate opening may include the following exemplary steps. A first mask structure (not shown) may be formed on the initial substrate and a first patterned layer may then be formed on the first mask structure. The first patterned layer may include an opening that exposes a portion of the first mask structure. The substrate opening may then be formed by etching a portion of the first mask structure and the initial substrate using the first patterned layer as an etch mask. Further, the first patterned layer and the first mask structure may be removed after forming the substrate opening.

In one embodiment, the first mask structure may include a first mask layer (not shown) formed on the initial substrate, and a second mask layer formed on the first mask layer. In other embodiments, the first mask structure may include a single layer, that is, the first mask structure may be a single-layer structure.

In one embodiment, the first mask layer may be made of nitrogen-doped (N-doped) silicon oxycarbide (SiOC). The first mask layer formed by N-doped silicon oxycarbide may have desired binding ability with the initial substrate. When the initial substrate is subsequently etched using the first mask layer as an etch mask, the first mask layer may not easily be peeled off or warped. Therefore, the first mask layer may have desired ability to maintain the etching pattern, which is conducive to ensure a desired shape for the substrate opening formed in the initial substrate. As such, the accuracy of the pattern obtained after etching may be effectively improved.

In one embodiment, the second mask layer may be made of titanium nitride ($TiN_x$). The second mask layer may have desired binding ability with the first mask layer. The second mask layer may be able to provide sufficient protection for the first mask layer when the initial substrate is etched in a subsequent process, such that the first mask layer may not be thinned. Further, the second mask layer may have strong physical strength. Therefore, the pattern of the first mask layer and the second mask layer may be stably maintained when the initial substrate is subsequently etched, such that the substrate opening is formed with a desired shape.

In other embodiments, the second mask layer may be made of a material including silicon carbide (SiC), silicon carbonitride (SiCN), silicon oxycarbonitride (SiOCN), silicon oxynitride (SiON), boron nitride (BN), boron carbonitride (BCN), or a combination thereof.

In one embodiment, each of the first mask layer and the second mask layer may be formed by an atomic layer deposition (ALD) process. In other embodiments, each of the first mask layer and the second mask layer may be formed by a chemical vapor deposition (CVD), physical vapor deposition (PVD), or spinning coating process.

In some embodiments, the first patterned layer may be made of photoresist. Forming the first patterned layer may include a photolithography process. Removing the first patterned layer may include a wet degumming process or an ashing process. When the ashing process is adopted to remove the first patterned layer, the processing gas used in the ashing process may be an oxygen-containing gas, for example, oxygen, ozone, or a combination thereof.

In one embodiment, removing the first mask structure may include a wet etching process. In other embodiments, removing the first mask structure may include a dry etching process. In one embodiment, the initial semiconductor structure 202 may be formed by an epitaxial deposition process.

The initial semiconductor structure 202 may be made of a semiconductor material doped with first type ions. In one embodiment, the semiconductor material may be Si. In other embodiments, the semiconductor material may be germanium (Ge), silicon germanium (SiGe), silicon carbide (SiC), gallium arsenide (GaAs), indium gallium (InGa), or a combination thereof. In one embodiment, doping the first type ions into the initial semiconductor structure 202 may include an in-situ doping process.

In one embodiment, the first type ions may be P-type ions, and the P-type ions may include boron ions. In other embodiments, the P-type ions may include indium ions or a combination of boron ions and indium ions. In other embodiments, the first type ions may also be N-type ions, and the N-type ions may include phosphorus ions, arsenic ions, or a combination thereof.

Figure 5:
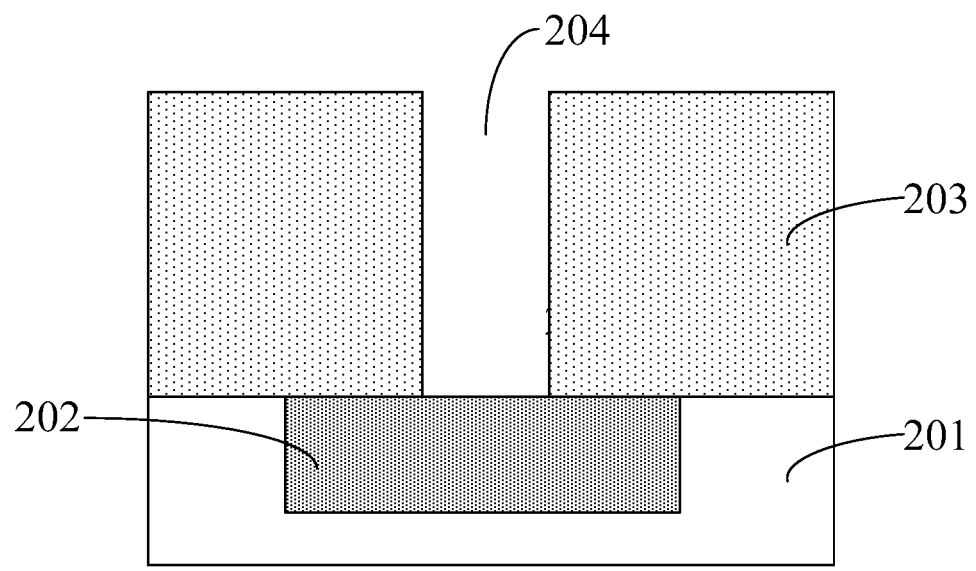

Referring to FIG. 12, in S102, a dielectric layer may be formed on the substrate, and a first opening may be formed in the dielectric layer to expose the initial semiconductor structure. FIG. 5 illustrates a schematic cross-sectional view of a semiconductor structure according to some embodiments of the present disclosure.

Referring to FIG. 5, a dielectric layer 203 may be formed on the substrate 201, and a first opening 204 may be formed in the dielectric layer 203. The first opening 204 may expose a portion of the initial semiconductor structure 202. That is, a portion of the top surface of the initial semiconductor structure 202 may be exposed by the first opening 204.

In one embodiment, forming the dielectric layer 203 and the first opening 204 may include the following exemplary steps. An initial dielectric layer (not shown) may be formed on the substrate 201. A second mask structure may be formed on the initial dielectric layer. A second patterned layer (not shown) may be formed on the second mask structure. An opening may be formed in the second patterned layer and the opening may expose a portion of the initial dielectric layer. Further, a portion of the second mask structure and the initial dielectric layer may be etched using the second patterned layer as an etch mask until the initial semiconductor structure 202 is exposed. As such, the dielectric layer 203 and the first opening 204 may be formed. Further, the second patterned layer and the second mask structure may be removed after forming the dielectric layer 203 and the first opening 204.

The initial dielectric layer may be made of a material including silicon oxide ($SiO_2$), a low-K dielectric material (a low-K dielectric material refers to a dielectric material with a relative dielectric constant below 3.9), or an ultra-low-K dielectric material (an ultra-low-K dielectric material refers to a dielectric material with a relative dielectric constant below 2.5).

When the initial dielectric layer is made of a low-K dielectric material or an ultra-low-K dielectric material, the material of the initial dielectric layer may be carbosiloxyhydride (SiCOH), fluorosilicate glass (FSG), borosilicate glass (BSG), phosphosilicate glass (PSG), borophosphosilicate glass (BPSG), hydridosilsesquioxane, or methylsilsesquioxane.

In one embodiment, the initial dielectric layer may be made of an ultra-low-K dielectric material (with a dielectric constant below 2.5), and the ultra-low-K dielectric material may be carbosiloxyhydride (SiCOH).

The initial dielectric layer may be formed by an ALD process, a CVD process, a PVD process, or a spinning coating process. In one embodiment, the initial dielectric layer may be formed by a CVD process.

In one embodiment, the second mask structure may, similar to the first mask structure described above, include a first mask layer and a second mask layer. For the first mask layer and the second mask layer of the second mask structure, reference may be made to corresponding description in the first mask structure provided above, and the details will not be repeated here. In other embodiments, the second mask structure may have a single-layer structure. For example, the second mask structure may only include a single layer.

In one embodiment, the second patterned layer may be made of photoresist, and forming the second patterned layer may include a photolithography process.

Removing the second patterned layer may include a wet degumming process or an ashing process. When an ashing process is performed to remove the second patterned layer, the processing gas used in the ashing process may include an oxygen-containing gas, for example, oxygen, ozone, or a combination thereof.

In one embodiment, removing the second mask structure may include a wet etching process. In other embodiments, removing the second mask structure may include a dry etching process.

Figure 6:
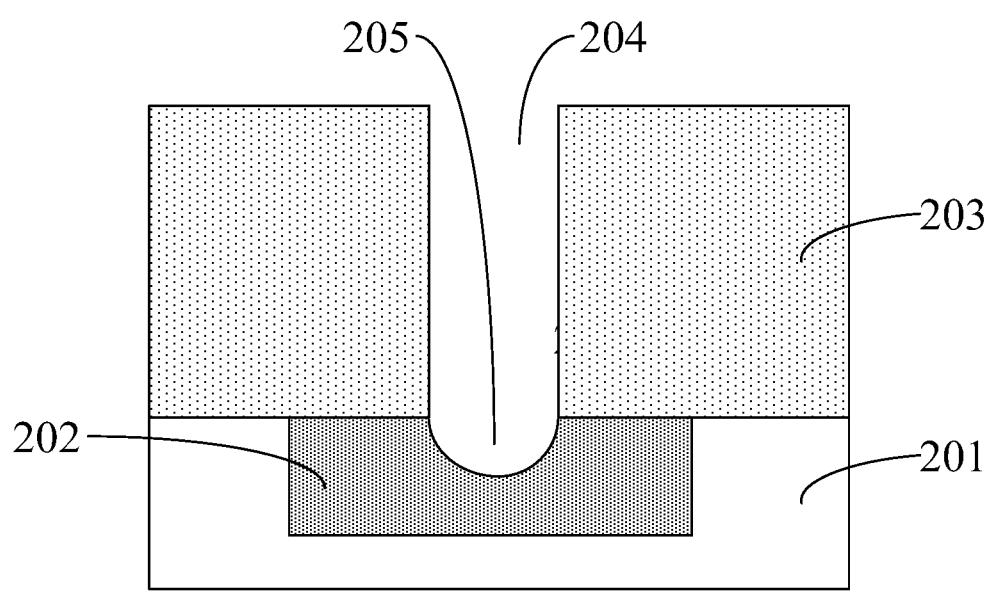

Referring to FIG. 12, in S103, the portion of the initial semiconductor structure exposed at the bottom of the first opening may be etched to form a second opening in the initial semiconductor structure. FIG. 6 illustrates a schematic cross-sectional view of a semiconductor structure according to some embodiments of the present disclosure.

Referring to FIG. 6, the portion of the initial semiconductor structure 202 exposed at the bottom of the first opening 204 may be etched to form a second opening 205 in the initial semiconductor structure 202. In one embodiment, etching the initial semiconductor structure 202 may include a dry etching process. After the second opening 205 is formed, a contact layer may be subsequently formed in the second opening 205.

Figure 7:
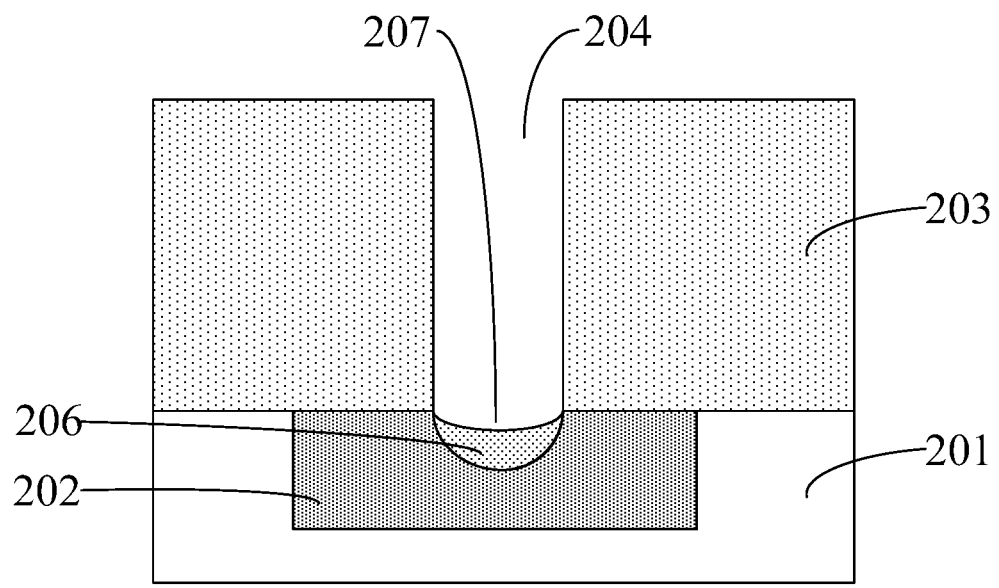

Referring to FIG. 12, in S104, an initial contact layer may be formed in the second opening, and after forming the initial contact layer, an initial third opening may be formed above the top surface of the initial contact layer and under the first opening. FIG. 7 illustrates a schematic cross-sectional view of a semiconductor structure according to some embodiments of the present disclosure.

Referring to FIG. 7, an initial contact layer 206 may be formed in the second opening 205 (referring to FIG. 6). After forming the initial contact layer 206, an initial third opening 207 may be formed above the top surface of the initial contact layer 206 by performing a sputtering process on the initial contact layer 206. For example, after performing the sputtering process, the initial contact layer 206 may have a concave top surface, such that the initial third opening 207 may be formed above the top surface of the initial contact layer 206. Therefore, the initial third opening 207 may have a concave bottom surface. The initial third opening 207 may be vertically connected to the first opening 204.

Figure 8:
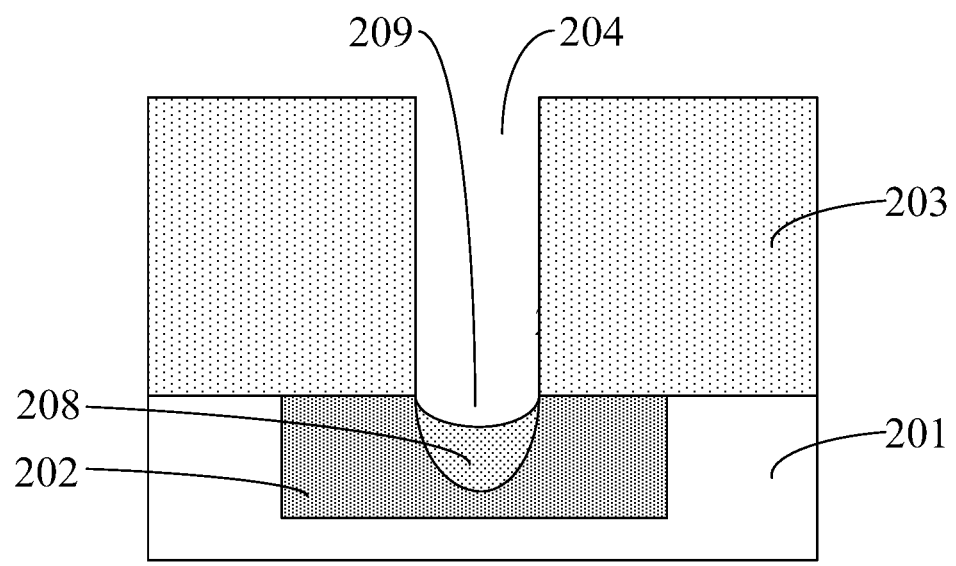

Further, returning to FIG. 12, in S105, an annealing process may be performed on the initial contact layer to form a contact layer, and a third opening may be simultaneously formed in the contact layer from the initial third opening. FIG. 8 illustrates a schematic cross-sectional view of a semiconductor structure according to some embodiments of the present disclosure.

Referring to FIG. 8, the initial contact layer 206 (referring to FIG. 7) may be annealed to form a contact layer 208 and a third opening 209 in the contact layer 208. For example, after the initial contact layer 206 is annealed, the initial contact layer 206 may be converted to the contact layer 208. In the meantime, the initial third opening 207 (referring to FIG. 7) may become the third opening 209. The third opening 209 may be vertically connected to the first opening 204. It should be noted that the contact layer 208 may not have an exactly the same top surface as the initial contact layer 206 due to the annealing effect, however, the contact layer 208 may still have a concave top surface, above which the third opening 209 is located.

In one embodiment, forming the initial contact layer 206 may include a PVD process. Because the initial contact layer 206 only needs to be formed in the second opening 205 and does not need to be formed on the sidewall surface of the first opening 204, using a PVD process to form the initial contact layer 206 may be able to satisfy the process requirement.

The initial contact layer 206 may be made of a material including titanium, nickel, platinum, or a combination thereof. In one embodiment, the initial contact layer 206 may be made of titanium.

The initial third opening 207 may be formed by performing a sputtering process on the initial contact layer 206. The ions used in the sputtering process may include titanium ions, argon ions, or a combination thereof. In one embodiment, the ions used in the sputtering process may include titanium ions. When titanium ions are used in the sputtering process, the same equipment can be used for both titanium-ion sputtering and titanium deposition, such that replacing the equipment during the fabrication process may not be necessary, thereby effectively improving the production efficiency.

The processing time of the titanium-ion sputtering process may be in a range of approximately 15 seconds to 25 seconds, and the sputtering power of the titanium-ion sputtering process may be in a range of approximately 1800 W to 2200 W. In one embodiment, the processing time of the sputtering process may be 20 seconds, and the sputtering power of the sputtering process may be 2000 W.

The annealing parameters include an annealing temperature in a range of approximately 750° C. to 850° C., and an annealing time in a range of approximately 170 seconds to 190 seconds. In one embodiment, the annealing temperature may be 800° C., and the annealing time may be 180 seconds.

The bottom surface of the initial third opening 207 may be the top surface of the initial contact layer 206. In one embodiment, after performing the sputtering process on the initial contact layer 206, the top surface of the initial contact layer 206 may become a concave surface. That is, the initial contact layer 206 may have a concave top surface. Correspondingly, the initial third opening 207 may have a concave bottom surface. Further, after performing the annealing process, the formed third opening 209 may also have a concave bottom surface.

Figure 9:
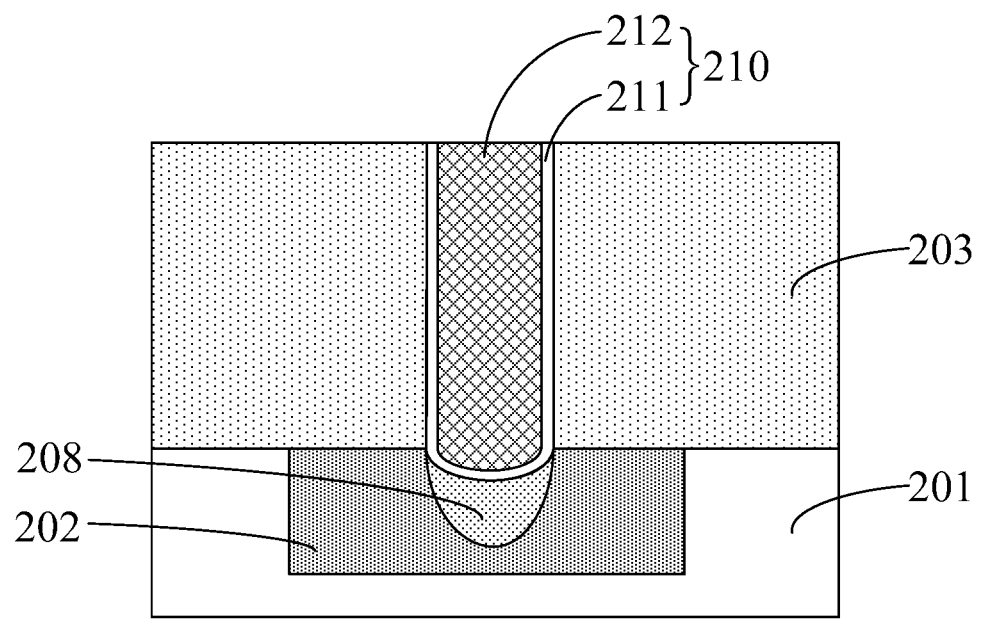

Returning to FIG. 12, in S106, a conductive structure may be formed in the first opening and the third opening. FIG. 9 illustrates a schematic cross-sectional view of a semiconductor structure according to some embodiments of the present disclosure.

Referring to FIG. 9, a conductive structure 210 may be formed in the first opening 204 (referring to FIG. 8) and the third opening 209 (referring to FIG. 8). In one embodiment, the conductive structure 210 may include a barrier layer 211 and a conductive plug 212 formed on the surface of the barrier layer 211. The barrier layer 211 may be formed on the surface of the third opening 209 and the sidewall surface of the first opening 204.

With a same width (for example, a same dimension in a direction parallel to the top surface of the substrate 201), the area of the concave surface of the third opening 209 is larger than the area of the horizontally-flat surface. Therefore, the contact area between the contact layer 208 and the barrier layer 211 may be effectively increased. Because along the direction of the electrical path of the conductive structure 210, the contact area is increased, which is equivalent to connecting an extra resistor in parallel, the total resistance may become smaller. As such, the contact resistance between the conductive structure 210 and the contact layer 208 may be reduced.

In one embodiment, the conductive structure 210 may be formed after the contact layer 208 is formed. That is, after performing the annealing process on the initial contact layer 206 (referring to FIG. 7) to form the contact layer 208, the conductive structure 210 may then be formed. In other embodiments, the conductive structure may be formed prior to forming the contact layer. For example, after forming the initial contact layer and performing the sputtering process to form the initial third opening, the conductive structure may be formed on the concave top surface of the initial contact layer. In a subsequent process, an annealing process may be performed to convert the initial contact layer to contact layer.

In one embodiment, the barrier layer 211 may be made of a material including titanium nitride ($TiN_x$). The barrier layer 211 may be used to not only adhere the conductive plug 212 but also prevent the metal of the conductive plug 212 from penetrating outward and thus causing metal pollution.

In one embodiment, forming the barrier layer 211 may include an ALD process. Since the ALD process is a method that can deposit a material on the surface of the substrate layer by layer in the monoatomic-film form, the ALD process has desired shape retention. Therefore, the barrier layer 211 formed by the ALD process can maintain the concave profile of the surface of the third opening 209. As such, the contact interface between the barrier layer 211 and the conductive plug 212 can also be ensured to have a concave structure. With the same width, the area of the concave surface is larger than the area of the horizontally-flat surface. Therefore, the contact area between the conductive plug 212 and the barrier layer 211 may be effectively increased. Because along the direction of the electrical path of the conductive structure 210, the contact area is increased, which is equivalent to connecting an extra resistor in parallel, the total resistance may become smaller. As such, the contact resistance between the conductive structure 210 and the contact layer 208 may be reduced.

In one embodiment, the conductive plug 212 may be made of a material including cobalt (Co). In other embodiments, the conductive plug 212 may be made of a material including tungsten (W), copper (Cu), or aluminum (Al).

Correspondingly, the present disclosure also provides a semiconductor structure formed by the method described above. FIG. 9 illustrates a schematic cross-sectional view of an exemplary semiconductor structure according to some embodiments of the present disclosure.

Referring to FIG. 9, the semiconductor structure may include a substrate 201, an initial semiconductor structure 202 disposed in the substrate 201, a dielectric layer 203 formed on the substrate 201, a first opening (not labeled) formed vertically through the dielectric layer 203 and above the initial semiconductor structure 202, and a second opening (not labeled) formed in the initial semiconductor structure 202 below the first opening. That is, the first opening and the second opening may be connected to each other with the first opening located above the second opening.

The semiconductor structure may further include a contact layer 208 formed in the second opening, and a third opening formed in the contact layer 208. The contact layer 208 may have a concave top surface and the third opening (not labeled) may expose the concave top surface of the contact layer 208. Therefore, the third opening may be a top portion of the second opening that is connected to the first opening. The semiconductor structure may further include a conductive structure 210 formed in the first opening and the third opening. In one embodiment, the conductive structure 210 may include a barrier layer 211 and a conductive plug 212. The barrier layer 211 may be formed on the bottom surface of the third opening (e.g., the concave top surface of the contact layer 208) and the sidewall surface of the first opening. The conductive plug 212 may be formed on the barrier layer 211 and may fill up the first opening and the third opening.

Figure 10:
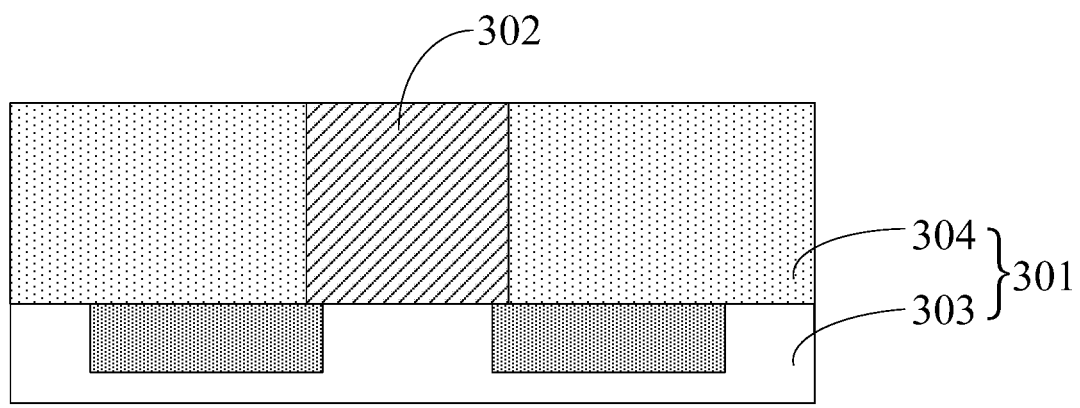
FIG. 10 and FIG. 11 illustrate schematic cross-sectional views of semiconductor structures at certain stages of another exemplary method for fabricating a semiconductor structure according to some embodiments in the present disclosure.
Figure 11:
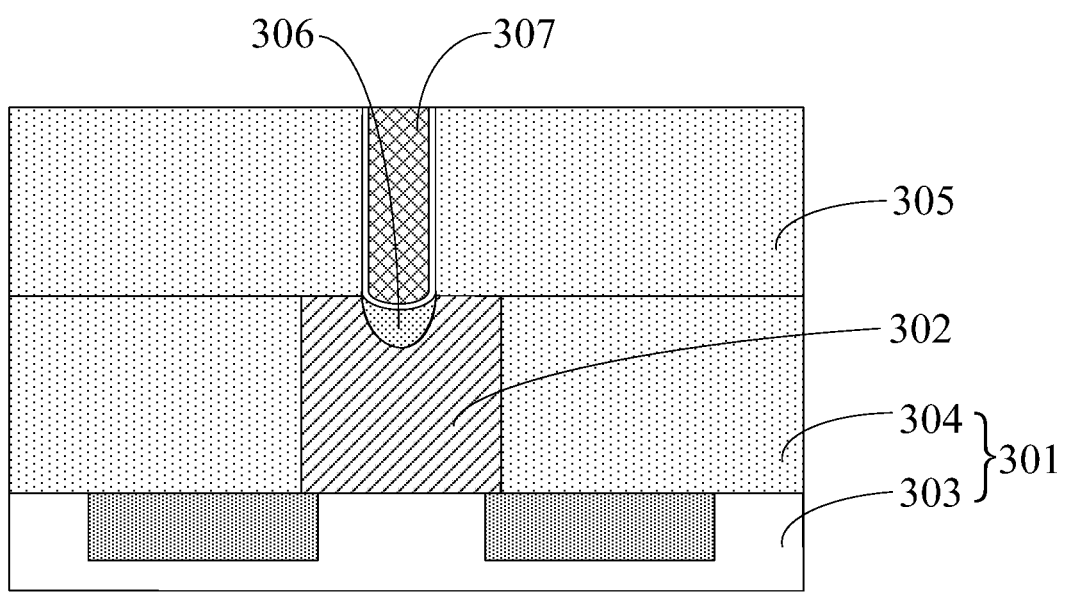

The present disclosure also provides another method for forming a semiconductor structure. FIG. 10 and FIG. 11 illustrate schematic cross-sectional views of semiconductor structures at certain stages of another exemplary method for fabricating a semiconductor structure according to some embodiments in the present disclosure.

Referring to FIG. 10, a substrate 301 may be provided, and the substrate 301 may include an initial semiconductor structure 302 formed in the substrate 301.

In one embodiment, the substrate 301 may have a multi-layer structure. For example, the substrate 301 may include a base substrate 303 and a device layer 304 disposed on the base substrate 303. The device layer may include a device structure, and a device dielectric layer surrounding the device structure. The initial semiconductor structure 302 may include the device structure.

The initial semiconductor structure 302 may be made of a semiconductor material, and the semiconductor material may include silicon (Si), germanium (Ge), silicon germanium (SiGe), silicon carbide (SiC), or a combination thereof.

In one embodiment, the device structure may be a gate structure. In other embodiments, the device structure may be a resistor structure, a capacitor structure, an inductor structure, or a memory gate structure.

Referring to FIG. 11, a dielectric layer 305 may be formed on the surface of the substrate 301, and a first opening may be formed through the dielectric layer 305 to expose a portion of the surface of the initial semiconductor structure 302. In one embodiment, the dielectric layer may be formed on the surfaces of the device dielectric layer and the initial semiconductor structure.

Further, a portion of the initial semiconductor structure 302 exposed at the bottom of the first opening may be etched to form a second opening in the initial semiconductor structure 302. A contact layer 306 may be formed in the second opening. The contact layer 306 may have a concave top surface, and the concave surface of the contact layer 306 may form a third opening. The third opening may be located under the first opening. Further, a conductive structure 307 may be formed in the first opening and the third opening.

For the specific process for forming the semiconductor structure, reference may be made to the corresponding description associated with FIG. 6 to FIG. 9, and the details will not be repeated here.

Correspondingly, the present disclosure also provides a semiconductor structure. FIG. 11 illustrates a schematic cross-sectional view of an exemplary semiconductor structure according to some embodiments of the present disclosure.

Referring to FIG. 11, the semiconductor structure may include a substrate 301 and an initial semiconductor structure 302 formed in the substrate 301. In one embodiment, the substrate 301 may have a multi-layer structure. For example, the substrate 301 may include a base substrate 303 and a device layer 304 disposed on the base substrate 303. The device layer may include a device structure, and a device dielectric layer surrounding the device structure. The initial semiconductor structure 302 may include the device structure.

The initial semiconductor structure 302 may be made of a semiconductor material, and the semiconductor material may include silicon (Si), germanium (Ge), silicon germanium (SiGe), silicon carbide (SiC), or a combination thereof.

The semiconductor structure may further include a dielectric layer 305 formed on the surface of the substrate 301, a first opening formed vertically through the dielectric layer 305 and above the initial semiconductor structure 302, and a second opening (not labeled) formed in the initial semiconductor structure 302 below the first opening. That is, the first opening and the second opening may be connected to each other with the first opening located above the second opening.

The semiconductor structure may further include a contact layer 306 formed in the second opening, and a third opening (not labeled) formed in the contact layer 306. The contact layer 306 may have a concave top surface and the third opening may expose the concave top surface of the contact layer 306. Therefore, the third opening may be a top portion of the second opening that is connected to the first opening. The semiconductor structure may further include a conductive structure 307 formed in the first opening and the third opening. For further description of the conductive structure 307 formed in the first opening and the third opening, reference may be made to the corresponding description in embodiments provided above, and the details will not be repeated here.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for forming a semiconductor structure, comprising:
providing an initial semiconductor structure, wherein the initial semiconductor structure is formed in a substrate;
forming a dielectric layer on the substrate;
forming a first opening in the dielectric layer to expose a portion of the initial semiconductor structure;
etching the portion of the initial semiconductor structure exposed at a bottom of the first opening to form a second opening in the initial semiconductor structure;
forming a contact layer in the second opening and a third opening in the contact layer, wherein the contact layer has a concave top surface, the third opening is located above the concave top surface of the contact layer and under the first opening, the third opening has a first concave bottom surface; and
forming a conductive structure in the first opening and the third opening, wherein the conductive structure includes a barrier layer formed on the first concave bottom surface of the third opening and a sidewall surface of the first opening, and a conductive plug formed on the barrier layer, the barrier layer and the contact layer are made of a first material, the conductive plug is made of a second material different from the first material, the barrier layer has a second concave bottom surface, and the conductive plug has a third concave bottom surface.

2. The method according to claim 1, wherein the substrate has a single-layer structure or a multi-layer structure.

3. A method for forming a semiconductor structure, comprising:
providing an initial semiconductor structure, wherein the initial semiconductor structure is formed in a substrate;
forming a dielectric layer on the substrate;
forming a first opening in the dielectric layer to expose a portion of the initial semiconductor structure;
etching the portion of the initial semiconductor structure exposed at a bottom of the first opening to form a second opening in the initial semiconductor structure;
forming a contact layer in the second opening and a third opening in the contact layer, wherein the contact layer has a concave top surface, and the third opening is located above the concave top surface of the contact layer and under the first opening; and
forming a conductive structure in the first opening and the third opening, wherein:
the substrate has a single-layer structure or a multi-layer structure, and
when the substrate has a single-layer structure, the substrate includes an initial substrate and an epitaxial layer formed in the initial substrate, and the initial semiconductor structure is the epitaxial layer.

4. The method according to claim 2, wherein:
when the substrate has a multi-layer structure, the substrate includes a base substrate and a device layer formed on the base substrate, the device layer includes a device structure and a device dielectric layer surrounding the device structure, and the initial semiconductor structure includes the device structure.

5. The method according to claim 3, further including:
doping first type ions into the initial semiconductor structure.

6. The method according to claim 5, wherein:
doping the first type ions into the initial semiconductor structure includes an in-situ doping process.

7. The method according to claim 5, wherein:
the first type ions include P-type ions or N-type ions;
the P-type ions include boron ions, indium ions, or a combination thereof; and
the N-type ions include phosphorus ions, arsenic ions, or a combination thereof.

8. A method for forming a semiconductor structure, comprising:

providing an initial semiconductor structure, wherein the initial semiconductor structure is formed in a substrate;

forming a dielectric layer on the substrate;

forming a first opening in the dielectric layer to expose a portion of the initial semiconductor structure;

etching the portion of the initial semiconductor structure exposed at a bottom of the first opening to form a second opening in the initial semiconductor structure;

forming a contact layer in the second opening and a third opening in the contact layer, wherein the contact layer has a concave top surface, and the third opening is located above the concave top surface of the contact layer and under the first opening; and forming a conductive structure in the first opening and the third opening, wherein forming the contact layer and the third opening includes:

forming an initial contact layer in the second opening;

performing a sputtering process on the initial contact layer to form an initial third opening in the initial contact layer, wherein the initial third opening is located under the first opening; and performing an annealing process on the initial contact layer to form the contact layer and the third opening in the contact layer.

9. The method according to claim 8, wherein:

forming the initial contact layer includes a physical vapor deposition (PVD) process.

10. The method according to claim 8, wherein:

processing parameters of the annealing process include an annealing temperature in a range of approximately 750° C. to 850° C. and an annealing time in a range of approximately 170 seconds to 190 seconds.

11. The method according to claim 8, wherein:

the initial contact layer is made of a material including titanium, nickel, platinum, or a combination thereof.

12. The method according to claim 8, wherein:

ions used in the sputtering process include titanium ions, argon ions, or a combination thereof.

13. The method according to claim 8, wherein:

processing parameters of the sputtering process include a sputtering time in a range of 15 seconds to 25 seconds and a sputtering power of 1800 W to 2200 W.

14. The method according to claim 8, wherein:

the conductive structure includes a barrier layer formed on a bottom surface of the third opening and a sidewall surface of the first opening, and a conductive plug formed on the barrier layer.

15. The method according to claim 14, wherein:

the conductive structure is formed prior to forming the contact layer; or the conductive structure is formed after forming the contact layer.

16. The method according to claim 14, wherein:

the barrier layer is made of a material including titanium nitride.

17. The method according to claim 14, wherein:

the barrier layer is formed by an atomic layer deposition (ALD) process.

18. The method according to claim 14, wherein:

the conductive plug is made of a material including tungsten, cobalt, copper, aluminum, or a combination thereof.

19. The method according to claim 8, wherein:

the initial third opening has a concave bottom surface.

* * * * *